United States Patent [19]
Hung

[11] Patent Number: 5,172,633
[45] Date of Patent: Dec. 22, 1992

[54] PRINTING SCREEN PLATE MAKING PROCESS AND THE DEVICE THEREFOR

[76] Inventor: Ti-Kun Hung, No. 39, Hsing Chung Str., Tai Ping Hsiang, Taichung Hsien, Taiwan

[21] Appl. No.: 803,434

[22] Filed: Dec. 6, 1991

[51] Int. Cl.⁵ ............................................. B41C 1/14
[52] U.S. Cl. ............................... 101/128.4; 101/401.1
[58] Field of Search .......................... 101/128.4, 401.1; 430/308

[56] References Cited

U.S. PATENT DOCUMENTS

| | | | |
|---|---|---|---|
| 242,919 | 6/1805 | Gestetner | 101/128.1 |
| 3,170,008 | 2/1965 | Levine | 101/395 |
| 3,372,639 | 3/1968 | Edwards | 430/308 |
| 4,475,458 | 10/1984 | Kennell et al. | 101/389.1 |

FOREIGN PATENT DOCUMENTS 0109662  8/1980  Japan .................................. 101/128.1

Primary Examiner—Edgar S. Burr
Assistant Examiner—Anthony H. Nguyen
Attorney, Agent, or Firm—Bacon & Thomas

[57] ABSTRACT

A printing screen plate making process and the device therefor, the device comprising a box having a transparent film, a screen holder and a rubber pad contained therein. By drawing the desired pattern on said transparent film and covering a screen on said screen holder with a layer of photoresist, and then, exposing said box to the sun, a sprinting screen plate is obtained after washing out the photoresist which was not exposed to the sun.

4 Claims, 2 Drawing Sheets

PRINTING SCREEN PLATE MAKING PROCESS AND THE DEVICE THEREFOR

BACKGROUND OF THE INVENTION

The present invention relates to a process for making a printing screen plate by exposing a pattern-drawn transparent film and a photoresist-coated screen to the sun. The present invention further relates to a device for performing such a process.

Screen plate printing method is a method to use a screen plate for printing the desired pattern on an object. Because it is suitable for printing a pattern on an uneven surface of an object, it is commonly used for printing marks and patterns on commercial and consumer products. Several printing screen plate making processes have been known. However, expensive hardware equipment shall be used in making printing screen plate according to the known methods. Although expensive hardware equipment is suitable for mass production, the manufacture cost for a printing screen plate is relatively increased. Operating and maintaining an expensive printing screen plate making machine are not easy. According to conventional methods, much electric energy will be consumed during the production of a printing screen plate. expensive hardware equipment Further, conventional printing screen plate making processes are not practical for making special printing screen plates of special sizes or at anywhere outdoors.

SUMMARY OF THE INVENTION

The present invention has been accomplished to eliminate the aforesaid disadvantages. It is therefore an object of the present invention to provide a printing screen plate making process which is easy and inexpensive to achieve and suitable for flexible printing requirement.

It is another object of the present invention to provide a printing screen plate making process which utilizes solar energy and eliminates the use of electric power.

It is still another object of the present invention to provide a printing screen plate making device which is inexpensive to manufacture and easy to delivery.

It is still another object of the present invention to provide a printing screen plate making device which is suitable for making a special size of printing screen plate.

A printing screen plate making device according to the present invention is generally comprised of a box comprised of two hinged compartments, a transparent film, a screen holder, and a rubber pad. The compartments include one having a transparent flat side wall for passing the sunlight. The screen holder has a screen stretched thereon. After having drawn the desired pattern on the transparent film and covered the screen on the screen holder with a layer of photoresist, the transparent film, the screen holder and the rubber pad are set in the box and exposed to the sun. 6 minutes after exposure to the sun under the light intensity of 10° the screen holder is removed from the box and dipped into a clean water to wash out the photoresist which was not exposed to the sun. A blank area corresponding to the pattern on the transparent film is formed in the screen of the screen holder, and therefore, a printing screen plate is made.

DETAILED DESCRIPTION OF THE PREFERRED EMBODIMENT

Figure 1:
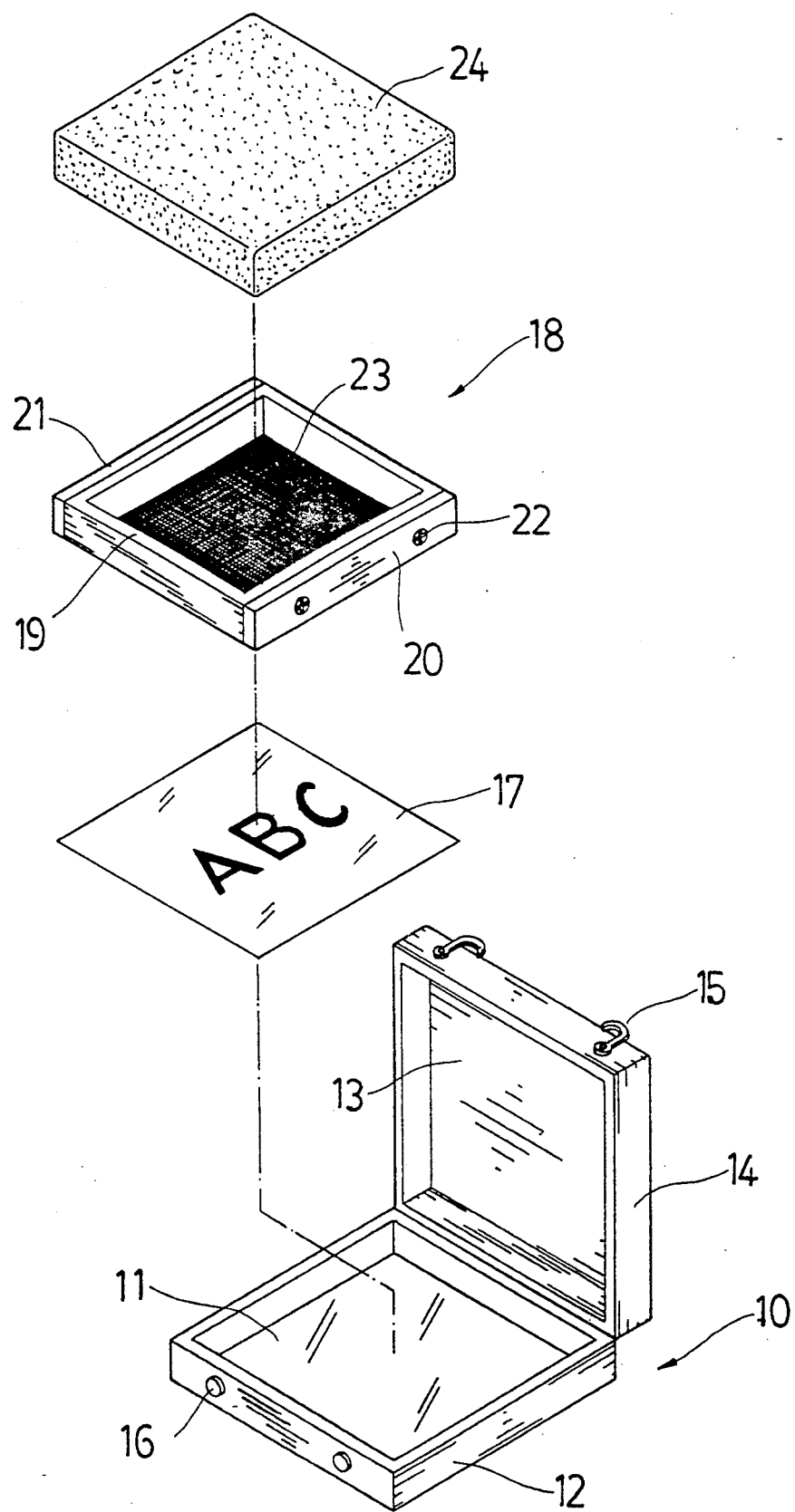
FIG. 1 is an exploded perspective view of a printing screen plate making device as constructed according to the present invention.

Referring to FIG. 1, a printing screen plate making device is generally comprised of a box 10 for containing a transparent film 17, a screen holder 18 and a rubber pad 24. The box 10 is comprised of two pivoted frames, namely, a bottom frame 12 for holding a flat bottom board 13 and a top frame 14 for holding a sheet of transparent glass 11. The top frame 14 has two opposite hooks 15 on the peripheral wall surface thereof at one side opposite to its pivoting side to the bottom frame 12. The bottom frame 12 has two opposite stub rods 16 on the peripheral wall surface thereof at locations for hooking the hooks 15 respectively. The transparent film 17 is made in size fitting the internal space of the box 10 and provided for drawing patterns thereon. The screen holder 18 comprises a rectangular frame 19 having two retaining blocks 20, 21 attached thereto at two opposite sides by screws 22 to secure a screen 23 thereon. The screen 23 is made in a rectangular shape slightly larger than the screen holder 18 and tightly stretched on the screen holder 18, having two opposite side edges secured to the outer wall surface of the screen holder 18 at two opposite sides by the two retaining blocks 20, 21 and the other two opposite side edges secured to the outer wall surface of the screen holder 19 at the other two opposite sides by pins or nails. The rubber pad 24 is made in size fitting the space defined within the screen holder 18.

Figure 2:
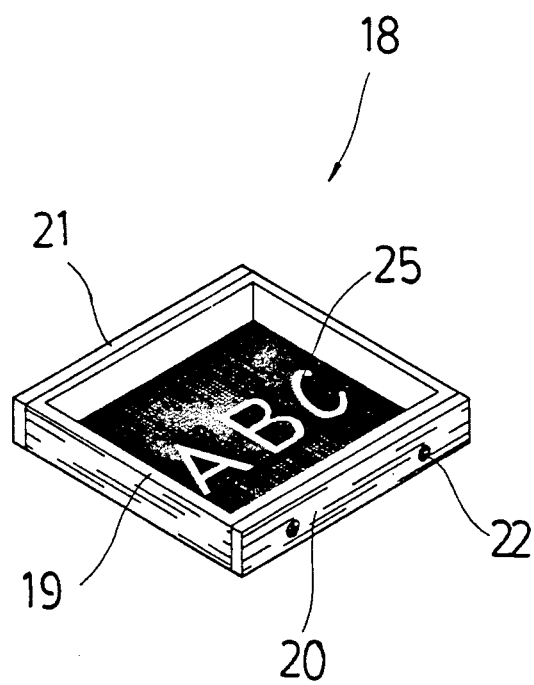
FIG. 2 is a perspective view of the screen holder showing the a spring screen is made according to the present invention.

The printing screen plate making process of the present invention is to use the aforesaid device. The process is outlined hereinafter. Draw the desired pattern on the transparent film 17 with an ink or paint which has a property to block light rays, and coat the screen 23 with a uniform layer of photo-resist. Then, place the film 17, the screen holder 18 and the rubber pad 24 in the box 10 with the film 17 firmly squeezed in between the sheet of transparent glass 11 and the screen 23. Then, close the box 10 by hooking the hooks 15 on the stub rods 16 respectively, and put the box 10 in a flat surface under the direct sun light with the bottom frame 12 disposed at the top. It is most preferably to sun the device for 6 minutes at high noon when the light intensity is at 10°. Under this base, the length of time in exposure may be increased or reduced one minute per every hour from high noon. After the aforesaid exposure procedure, the screen holder 18 is removed from the box 10 and swirl gently in a clean water causing the screen 23 to shake off the photoresist which was not exposed to the light of the sun. After washing, a blank area 25 which shows a pattern corresponding to the pattern on the film is formed on the screen 23 (see FIG. 2), and therefore, a screen plate is made for printing.

As indicated, a printing screen plate can be inexpensively conveniently made within a short length of time by using a printing screen plate-making device of the present invention. Any desired size of printing screen plate can be made without the use of any machinery equipment. Further, no any electric energy is consumed during the production of a printing screen plate.

I claim:

1. A printing screen plate making device comprising:
   a) a box, said box consisted of two hinged compartments movable between closed and open positions having two generally flat, opposite side walls, said two side walls including a first side wall made from the transparent material, and a second side wall;
   b) a transparent film received in said box, said transparent film having a surface thereon for drawing a pattern;
   c) a screen holder received in said box, said screen holder comprising a rectangular frame, a screen stretched on said rectangular frame, and a plurality of retaining blocks attached to said rectangular frame to secure said screen in place; and
   d) a rubber pad tightly set in said rectangular frame and received in said box between the second side wall and the screen such that the rubber pad urges the screen in contact with the transparent film and the transparent film against the transparent material when the compartments are in their closed positions.

2. A printing screen plate making process comprising the steps of:
   a) providing a printing screen plate making device comprising:
      i) a box, said box consisted of two hinged compartments movable between closed and open positions having two generally flat, opposite side walls, said two side walls including a first side wall made from the transparent material, and a second side wall;
      ii) a transparent film received in said box, said transparent film having a surface thereon for drawing a pattern;
      iii) a screen holder received in said box, said screen holder comprising a rectangular frame, a screen stretched on said rectangular frame, and a plurality of retaining blocks attached to said rectangular frame to secure said screen in place; and
      iv) a rubber pad tightly set in said rectangular frame and received in said box between the second side wall and the screen such that the rubber pad urges the screen in contact with the transparent film and the transparent film against the transparent material when the compartments are in their closed positions;
   b) drawing a desired pattern on the transparent film with a marking substance having a property of blocking light rays;
   c) coating the screen with a substantially uniform layer of photo-resist material;
   d) placing the transparent film and the screen into the box such that the transparent film is between the screen and the transparent material of the first side wall;
   e) closing the hinged compartments such that the rubber pad urges the screen in contact with the transparent film and the transparent film against the transparent material of the first side wall; and,
   f) exposing the box to the sun so as to permit direct sunlight to pass through the transparent material of the first side wall;
   g) removing the exposed screen from the box and subjecting the screen to a bath to remove the photo-resist material from the portions not exposed to sunlight.

3. The process according to claim 2 wherein said box is exposed to the sun for approximately 6 minutes at high noon.

4. The process according to claim 2 comprising the further step of increasing the exposure time to the sun one minute per every hour from high noon.

* * * * *